(12) United States Patent
Harrison et al.

(10) Patent No.: US 7,416,962 B2
(45) Date of Patent: Aug. 26, 2008

(54) METHOD FOR PROCESSING A SEMICONDUCTOR WAFER INCLUDING BACK SIDE GRINDING

(75) Inventors: Wesley Harrison, Portland, OR (US); Roland Vandamme, Portland, OR (US); David Gore, Portland, OR (US)

(73) Assignee: Siltronic Corporation, Portland, OR (US)

( * ) Notice: Subject to any disclaimer, the term of this patent is extended or adjusted under 35 U.S.C. 154(b) by 277 days.

(21) Appl. No.: 10/233,117

(22) Filed: Aug. 30, 2002

(65) Prior Publication Data

US 2004/0043616 A1 Mar. 4, 2004

(51) Int. Cl.
*H01L 21/30* (2006.01)
(52) U.S. Cl. ................... 438/459; 438/690; 438/693
(58) Field of Classification Search ......... 438/690–696, 438/459–460
See application file for complete search history.

(56) References Cited

U.S. PATENT DOCUMENTS

| 5,494,862 | A | | 2/1996 | Kato et al. | |
|---|---|---|---|---|---|
| 5,800,725 | A | * | 9/1998 | Kato et al. | 216/88 |
| 6,114,245 | A | * | 9/2000 | Vandamme et al. | 438/690 |
| 6,214,704 | B1 | | 4/2001 | Xin | |
| 6,491,836 | B1 | * | 12/2002 | Kato et al. | 216/88 |
| 6,530,381 | B1 | * | 3/2003 | Schwab et al. | 134/1.3 |
| 6,753,256 | B2 | * | 6/2004 | Hashii et al. | 438/689 |
| 2001/0039101 | A1 | * | 11/2001 | Wenski | 438/471 |
| 2002/0037650 | A1 | * | 3/2002 | Kishimoto | 438/692 |
| 2002/0052064 | A1 | * | 5/2002 | Grabbe et al. | 438/113 |

FOREIGN PATENT DOCUMENTS

| EP | 0755751 | 1/1997 |
|---|---|---|
| EP | 1005069 | 5/2000 |

* cited by examiner

*Primary Examiner*—H. Jey Tsai
(74) *Attorney, Agent, or Firm*—Kolisch Hartwell, P.C.

(57) ABSTRACT

A method is provided for processing the back side of a semiconductor wafer after the wafer has been lapped. The process includes grinding the back side of the wafer to remove wafer material, to substantially eliminate lap damage from the back side of the wafer. The back side of the wafer may then be cleaned, etched, and polished, after which the front side of the wafer is polished. The back side grinding may be accomplished after the lapping without any other step of substantial removal of wafer material. The polishing of the back side of the wafer may be performed with a CMP machine and may produce a specular surface, visually free of damage under haze lamp inspection, with removal of about 0.5 microns of wafer material. After polishing the front side of the wafer, an epitaxial layer may be produced on the front side of the wafer.

23 Claims, 1 Drawing Sheet

METHOD FOR PROCESSING A SEMICONDUCTOR WAFER INCLUDING BACK SIDE GRINDING

BACKGROUND

Semiconductor wafers are produced from crystal ingots by a series of processing steps, each step designed to bring the wafer closer to compliance with a specification for acceptable wafer characteristics. Each step may also prepare the wafer for a next step and/or remove residual damage from an earlier step. Wafer specifications vary depending on the use for which the wafer is destined, but, in general, the wafer must be processed so that its front and back surfaces are flat and defect free.

Flatness is measured in terms of total thickness variation (TTV) across the entire wafer surface and a site flatness characteristic, denoted SFQR, which is a measure of thickness variations within bins or small areas, known as sites, which typically are the same size as the dies for the prospective chips that will be cut from the wafer. Flatness may be measured by a process having a finer degree of resolution, known as nanotopography, which measures peak-to-valley changes within smaller bins, typically 2 mm×2 mm or 10 mm×10 mm, resulting in a characteristic known as height change threshold (HCT). Defects, such as pitting, typically are detected by visual inspection of the wafer surface, e.g., under a haze lamp.

A wafer is first sliced from an ingot or ingot segment by a rotating disc saw or a wire saw, which may also use an abrasive slurry. The wafer is then cleaned, e.g., by ultrasonic cleaning, to remove particles of the wafer, of the saw and/or of the slurry clinging to the surfaces of the wafer. The edge of the wafer is then ground to an exact diameter and the sharp corner of the edge is chamfered into a rounded edge, which is less likely to chip or otherwise lead to fracturing of the wafer.

The wafer is then lapped, typically between two rotating plates and with an abrasive slurry, to make the front and back surfaces flat and parallel to one another. The lapping also removes the surface damage that the saw and saw-slurry, if used, created on the wafer surfaces during the slicing step. The lapping typically improves the flatness of the wafer surfaces and makes them more parallel to one another, and also leaves a signature damage, albeit one less in magnitude than the slicing damage.

After lapping, the wafer typically is chemically etched on both surfaces with either or both of a mixed acid or an alkaline solution to remove the lapping damage. Then, at least the front wafer surface is polished, although the back surface may also be polished, either sequentially or simultaneously with the front, depending on the wafer's intended use. After polishing, the wafer is ready for cleaning and inspection prior to an optional deposition of an epitaxial layer on the front surface and further processing into integrated circuits.

A patent to Xin, U.S. Pat. No. 6,214,704, describes an application of a fine grinding process to the front surface of the wafer after lapping, and also requires that, during this grinding step, the lapping damage is left intact on the back surface of the wafer. After grinding the front surface, and etching only the front surface, Xin discloses, simultaneously polishing the front and back surfaces of the wafer. Xin discloses retaining the damage on the back surface of the wafer for the purpose of facilitating gettering on the back surface of the wafer.

A patent to Vandamme et al., U.S. Pat. No. 6,114,245, also describes an application of a fine grinding process to the front surface of the wafer after the etching that follows lapping of the wafer. Vandamme also describes front side fine grinding in a process not including a lapping step, and double side fine grinding in a process that does not including a lapping step or an etching step.

SUMMARY

An embodiment of the present invention includes, in a method for processing a semiconductor wafer that has been processed through a lapping stage, grinding the back side of the wafer so as to substantially eliminate the lap damage, and then preferably sequentially polishing the back side and the front side of the wafer. The grinding of the back side of the wafer is preferably a fine grinding, and is preferably performed after the lapping without an intervening step involving substantial removal of wafer material. The back side of the wafer preferably is polished after the grinding in a step separate from any front side polishing of the wafer. After the back side of the wafer is polished, the front side preferably is polished.

DETAILED DESCRIPTION

Figure 1:
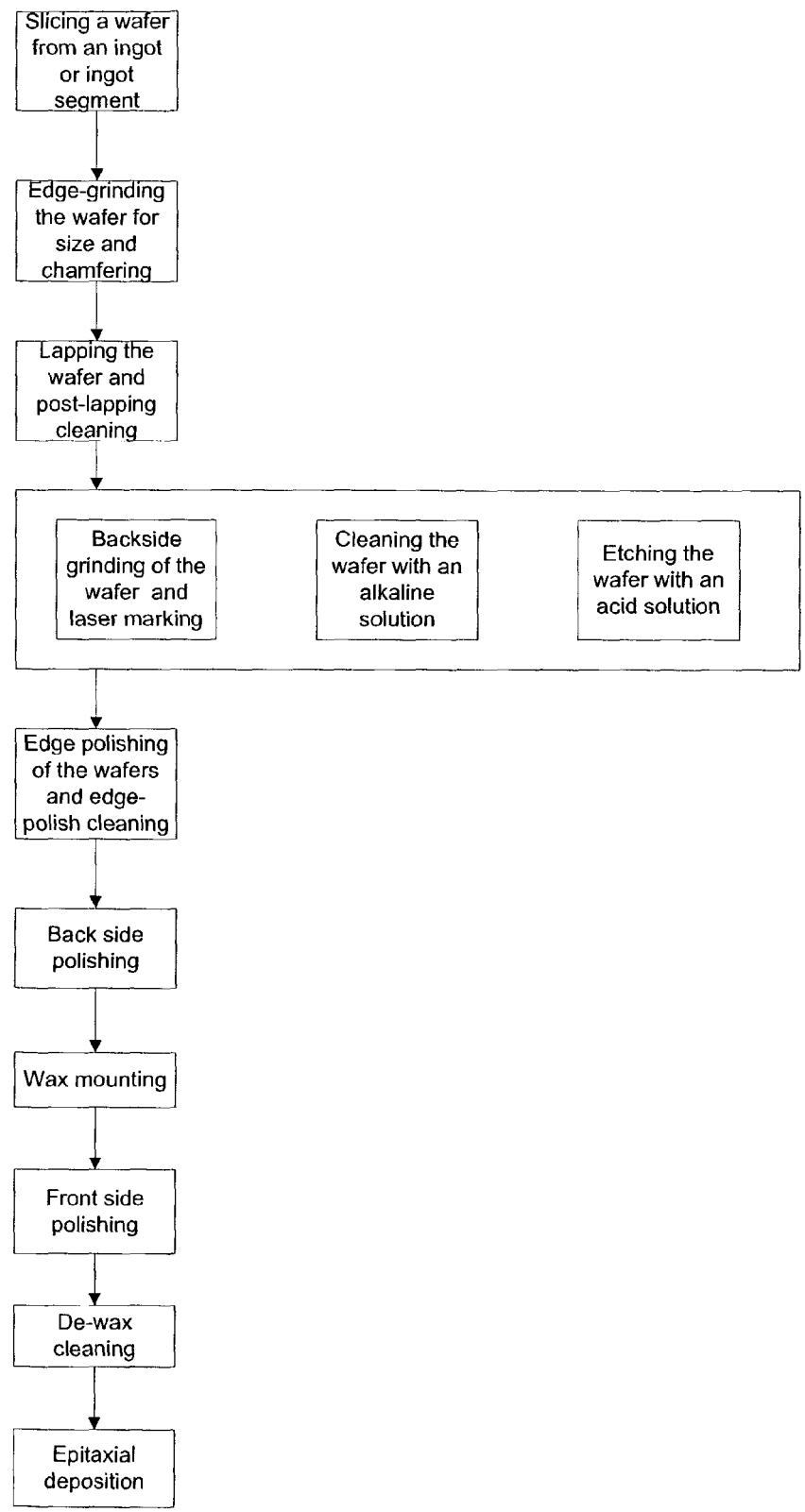
FIG. 1 is a flow diagram showing the steps for processing a semiconductor wafer according to the present invention.

As shown in FIG. 1, the first step in processing a wafer from a semiconductor ingot is slicing the wafer from the ingot or from an ingot segment, which will have already undergone trimming and the grinding of a flat or creation of a notch along the length of the ingot for reference purposes. The edge of the wafer is preferably then ground, both to reduce the diameter of the wafer to a desired size and to produce a chamfered edge of a suitable configuration. The shape and angle of the wafer edge are typically specified in accordance with requirements for subsequent processing of the wafer into integrated circuits.

The wafer, after slicing and edge grinding, bears a slicing damage on a front side and a back side of the wafer, which includes taper and bow from the sawing and non-parallelism of the front and back sides, as well as variations in thickness of the wafer and surface damage. The wafer is then lapped by any suitable lapping machine to reduce the slicing damage. Lapping preferably includes the introduction of an alumina-based slurry to both surfaces of the wafer while the wafer is pressed between two rotating alloy plates. The particle size of, e.g., $Al_2O_3$, in the lapping slurry is preferably in the range from at least about 7 microns to no more than about 15 microns, although this particle size can be adjusted to affect the time required for lapping to a targeted wafer-removal amount and to affect the depth of the resulting lapping damage.

The lapping process substantially removes the slicing damage, leaving the wafer flatter and with less damage on both surfaces of the wafer. The lapped wafer surfaces typically exhibit defects that extend into the surfaces a distance that is roughly of the same order as the particle size used in the lapping slurry.

The wafer preferably is cleaned after lapping to remove the slurry, and this cleaning step typically does not remove any substantial amount of wafer material.

Then, the back side of the wafer is subjected to a grinding process, preferably a fine grinding process. Preferably, the fine grinding of the back side of the wafer substantially eliminates the lapping damage. As described above, the magnitude of the lapping damage may vary according to characteristics of the lapping process. Preferably, in the back side fine grinding, between at least about 5 microns and no more than about 18 microns of wafer material are removed, and most preferably in the range of at least about 10 microns to no more than about 12 microns of wafer material are removed.

The step of back side fine grinding is preferably performed using a grinding apparatus incorporating a vertical spindle and a circumferential grinding wheel, i.e., one where the grinding wheel spins about a central axis, which axis is substantially aligned during grinding with the outer circumference or edge of the wafer. Also, during grinding, the wafer is preferably rotated about a central axis in a direction opposite to that of the grinding wheel. The DFG840 grinder made by the Disco Corporation of Japan is an example of a suitable grinding apparatus.

The grinding wheel in the back side fine grinding is typically spinning at least about 3000 RPM, and preferably at least about 4500 RPM, and most preferably in the range between about 5000 RPM and about 6000 RPM. The grinding wheel is fed toward the wafer at an in-feed rate of typically at least about 0.18 microns/sec and no more than about 1 micron/sec. Preferably, the in-feed rate for an optimal back side surface is about 0.33 microns/sec.

The grinding wheel includes a surface composed preferably of diamond particles embedded in a resin matrix. Typically, the particles are at least as small as about 1500 mesh, such as in one of the IF-01-1-5/10 wheels made by Disco, which has specified grit size of about 5 to about 10 microns. Preferably, the particles are at least as small as about 2000 mesh, such as in one of the IF-01-1-4/6 wheels made by Disco, which has specified grit size of about 4 to about 6 microns. Typically an aqueous solution, or other suitable solution is used as a lubricant during the back side fine grinding. Alternatively, other types of grinding apparatus or other apparatus for removing wafer material may be used in place of the grinder so as to substantially eliminate lapping damage.

After grinding, the wafer is preferably marked with a laser to establish a unique identity code for the wafer and to distinguish the front and back surfaces. In general, the front surface will be used in subsequent processing for the deposition of devices in an integrated circuit.

Also after the lapping, and preferably not until after the back side fine grinding, the wafer preferably is cleaned with an alkaline solution and then preferably etched with a mixed acid solution. Alternatively, the alkaline and/or acid solution may be applied prior to the back side fine grinding. It is believed that a more viscous lubricant than water may be required if back side fine grinding is performed after application of the alkaline and/or acid solution.

The cleaning with the alkaline solution is preferably combined with application of ultrasonic energy. Preferably, about 4 microns of wafer material are removed in this step. The total removal of wafer material by the application of the alkaline and acid solutions is typically about 20 microns to about 35 microns. The etching with acid preferably removes between about 28 and 32 microns of wafer material. Preferably, after etching, the wafer will exhibit a TTV of less than about 3.0 microns, and more preferably less than about 1.5 microns.

After grinding, the wafers may be processed by edge polishing, and an edge-polish cleaning step, by conventional means.

Then, the back side of the wafer is preferably polished by a chemical-mechanical polishing (CMP) machine, preferably using a colloidal silica slurry having a pH between about 10.5 and 12. An example of a suitable CMP machine is the Auriga C machine made by SpeedFam-Ipec Corporation of Chandler, Ariz. Preferably the wafer is mounted by vacuum to an olympian carrier without wax mounting of the wafer for the back side polishing step, as is the case with the Auriga C machine.

The polishing of the back side of the wafer preferably produces a specular surface that is visually free of defect under inspection under a haze lamp after a removal of only about 0.5 microns of wafer material. Preferably, the polishing of the back side removes no more than about 4 microns of wafer material, and more preferably no more than about 1.75 microns. It is believed that the polishing of the back side in this range optimizes planarization of the wafer back side, which may assist in producing a flatter front side of the wafer in subsequent processing. Typically, the back side polishing is accomplished in no more than about 1.5 minutes. Alternatively, the back side of the wafer may be polished in a wax mounting system, as described below for front side polishing.

Preferably after the back side polishing, the front side of the wafer is polished. In the preferred mode of front side polishing, a hot tacky wax is applied to the back side of the wafer and the wafer is then mounted on a flat, preferably alumina plate by stamping with an air bladder system. After stamping, the wax cools, hardens, and acts as a light adhesive between the wafer backside and the alumina polishing plate. During the stamping, the back side of the wafer is believed to be made flat, i.e., planarized relative to the plate and any irregularity of the back side is transferred through the bulk of the wafer to the surface of the front side. In the subsequent polishing, the front side is then planarized relative to the flat alumina polishing plate. To the extent that the back side of the wafer is planarized relative to the plate, which planarization may also be improved to the extent the back side of the wafer was planarized in the back side polishing step, the front side will also be planarized relative to the back side of the wafer, resulting in improved measures of flatness for the wafer.

An alkali colloidal silica slurry is used to polish the front side of the wafer, also removing residual damage from the front surface remaining from the lapping, cleaning, and/or etching steps. Typically about 8 microns to about 15 microns are removed from the front side of the wafer in the front side polishing step. The resultant surface is specular and visually free of damage under haze lamp inspection.

Typically, a plastic knife is used to separate the wafer from the alumina plate and any residual wax remaining on the wafer is removed from the back surface through a cleaning step. Multiple wafers run through the same process are then visually inspected for any irregularities and sorted for flatness and particulate contamination.

Typically, a thin layer of epitaxial silicon may be thermally deposited on the front side of the wafer, or not, depending on the wafer's intended use. The wafer is now ready for subsequent processing into integrated circuits or other devices. After deposition of the epitaxial layer, wafers processed in accordance with this invention exhibit HCT levels of less than 22 nm in the 2×2 bin and less than 70 nm in the 10×10 bin.

The subject matter described herein includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements. It is believed that the following claims particularly point out certain combinations and subcombinations that are directed to one of the disclosed embodiments and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the present disclosure.

What is claimed is:

1. A method of processing a semiconductor wafer, the wafer defining a front side and a back side, the wafer having been previously processed through a lapping stage and including a lap damage on the back side, the method comprising the steps of:

grinding the back side of the wafer to remove wafer material, to substantially eliminate the lap damage, the grinding the back side of the wafer being the sole grinding step of the method and the grinding the back side of the wafer being the sole step of substantial removal of wafer material after the lapping stage;

after the step of back side grinding, etching the wafer;

after the steps of back side grinding and etching, sequentially polishing the back side and the front side of the wafer, removing 0.5 to 4 um of the wafer material during polishing the back side.

2. The method of claim 1 further comprising, after the step of back side grinding and prior to the step of polishing the back side of the wafer, treating the wafer with an alkaline substance.

3. The method of claim 2 wherein the step of cleaning with the alkaline solution includes an application of ultrasonic energy to the wafer.

4. The method of claim 1 wherein the step of back side grinding includes use of a circumferential grinder.

5. The method of claim 1 wherein the step of back side grinding includes use of a grinding element comprising particles at least as small as about 1500 mesh.

6. The method of claim 1 wherein the step of back side grinding includes a grinding element removing wafer material at a feed rate of no more than about 1 micron/sec.

7. The method of claim 1 wherein the step of back side grinding removes at least about 5 microns of wafer material from the back side of the wafer.

8. The method of claim 1 wherein the step of back side grinding removes no more than about 18 microns of wafer material from the back side of the wafer.

9. The method of claim 1 wherein the step of back side grinding includes the use of a lubricant substantially comprising water.

10. The method of claim 1 wherein the step of polishing the back side of the wafer includes the removal of no more than about 4 microns of wafer material.

11. The method of claim 1 wherein the step of polishing the back side of the wafer includes the removal of about 0.5 microns of wafer material.

12. The method of claim 11 wherein the step of polishing the back side of the wafer produces a specular surface.

13. The method of claim 12 wherein the specular surface is visually free of damage under haze lamp inspection.

14. The method of claim 1 wherein the step of polishing the back side of the wafer is performed prior to the step of polishing the front side of the wafer.

15. The method of claim 1 wherein, prior to the step of polishing the front side of the wafer, the wafer is mounted to a flat plate.

16. The method of claim 15 wherein prior to the step of polishing the front side of the wafer, the wafer is wax mounted to the flat plate.

17. The method of claim 1 wherein after the steps of polishing the back side and the front side of the wafer, an epitaxial layer is produced on the front side of the wafer.

18. The method of claim 1 wherein the step of polishing the back side of the wafer is performed without wax mounting the wafer.

19. The method of claim 18 wherein the step of polishing the back side of the wafer is performed with a CMP machine.

20. The method of claim 1 further comprising, after the step of back side grinding and prior to the step of polishing the back side of the wafer, treating the wafer with an acid substance.

21. The method of claim 20 wherein the acid substance is a mixed acid solution.

22. The method of claim 1, wherein a step of fine grinding is performed to remove damage from the back side of the wafer.

23. A method of claim 1, further comprising after lapping the wafer, treating the wafer with an alkaline substance and treating the wafer with an acid substance.

* * * * *